United States Patent [19]

Hanke et al.

[11] Patent Number: 5,391,945
[45] Date of Patent: Feb. 21, 1995

[54] CIRCUIT AND METHOD FOR PROVIDING PHASE SYNCHRONIZATION OF ECL AND TTL/CMOS SIGNALS

[75] Inventors: C. Christopher Hanke, Austin, Tex.; Todd Pearson, Phoenix; Ray D. Sundstrom, Chandler, both of Ariz.

[73] Assignee: Motorola, Inc., Schaumburg, Ill.

[21] Appl. No.: 125,729

[22] Filed: Sep. 24, 1993

[51] Int. Cl.⁶ .............. H03K 19/088; H03K 19/092; H03K 19/0175
[52] U.S. Cl. ..................... 327/156; 327/141; 327/292; 326/93
[58] Field of Search ............ 307/262, 265, 271, 446, 307/456, 511, 514, 517, 525, 527, 528, 590

[56] References Cited

U.S. PATENT DOCUMENTS 4,678,944 7/1987 Williams ........................ 307/475
5,038,057 8/1991 Dixon et al. ..................... 307/446
5,264,745 11/1993 Woo .............................. 307/475

Primary Examiner—William L. Sikes
Assistant Examiner—Fetsum Abraham
Attorney, Agent, or Firm—Rennie W. Dover

[57] ABSTRACT

A circuit and method for providing phase synchronization between an ECL output signal and a TTL or CMOS output signal has been provided. The circuit includes phase locked loops (20, 24) to make the difference of delays through an ECL-TTL/CMOS translation path with that of a straight ECL path irrelevant. As a result, in order to achieve phase synchronization between an ECL signal and a TTL/CMOS signal, one only needs to match the propagation delay of a delay component (22) to that of a TTL/CMOS-ECL translator (26) as opposed to a delay component and an ECL-TTL/CMOS translator.

12 Claims, 1 Drawing Sheet

CIRCUIT AND METHOD FOR PROVIDING PHASE SYNCHRONIZATION OF ECL AND TTL/CMOS SIGNALS

FIELD OF THE INVENTION

This invention relates to phase synchronization and, in particular but not limited to, synchronizing the phase of differential ECL signals with TTL/CMOS signals.

BACKGROUND OF THE INVENTION

The likelihood of mixing differential ECL (Emitter-Coupled Logic) logic signals with TTL (Transistor-Transistor Logic)/CMOS (Complementary Metal Oxide Semiconductor) logic signals in a single application is increasing especially as microprocessor based system frequencies and complexity increase. In particular, the use of differential ECL signals is needed in order to maintain signal integrity and reduce noise at high frequencies. Moreover, in synchronous systems, these differential ECL signals must be in phase with the TTL/CMOS signals.

The basic problem in mixing differential ECL signals and TTL/CMOS signals is that the differential ECL signal path is substantially different from a single ended TTL/CMOS signal path. Moreover, these signal paths differ with process and system variations.

Referring to FIG. 1, there is illustrated a detailed block diagram of a traditional prior art approach to this problem. Differential ECL input signal is supplied to differential ECL signal path block 12 as well as ECL to TTL/CMOS translation block 14 wherein it is understood that block 14 may be either an ECL-TTL translator or an ECL-CMOS translator. The output of ECL signal path block 12 is passed through delay component 16 to provide a differential ECL output signal. Also, the output of translation block 14 provides a TTL/CMOS output signal.

The basic problem is that the signal path having the ECL-TTL/CMOS translation block is much slower than the straight ECL signal path. For example, a typical state of the art ECL-TTL translator may have a propagation delay of 3 ns (nanoseconds). Moreover, a state of the art ECL-CMOS translator may have a propagation delay of 2.5 ns. Thus, delay component 16 must be used to match the ECL signal path with the TTL/CMOS signal path. However, due to the long delays of the translation blocks, maintaining good delay matching while considering process, temperature and voltage supply variation is cumbersome if not impossible for systems operating at high frequencies.

Hence, there exists a need for an improved technique for providing phase synchronization of ECL logic signals and TTL/CMOS logic signals.

DETAILED DESCRIPTION OF THE DRAWINGS

Figure 1:
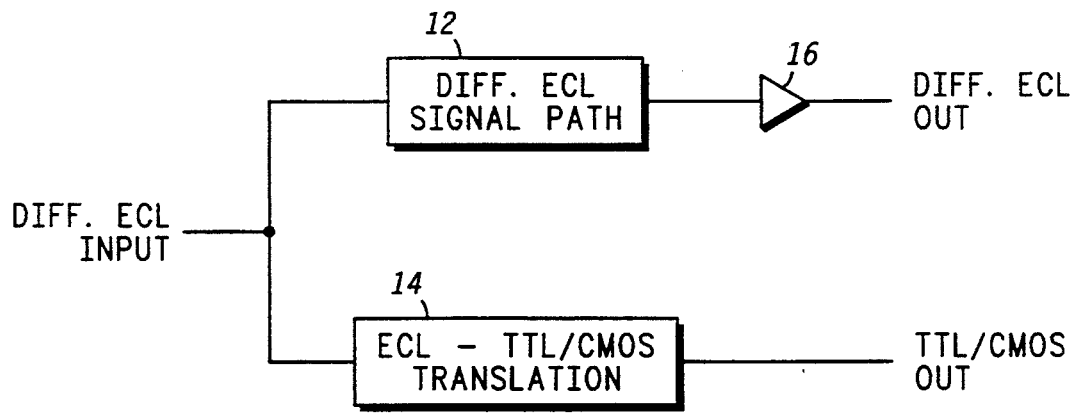
FIG. 1 illustrates a prior art technique for providing phase synchronization between ECL logic signals and TTL/CMOS logic signals.
Figure 2:
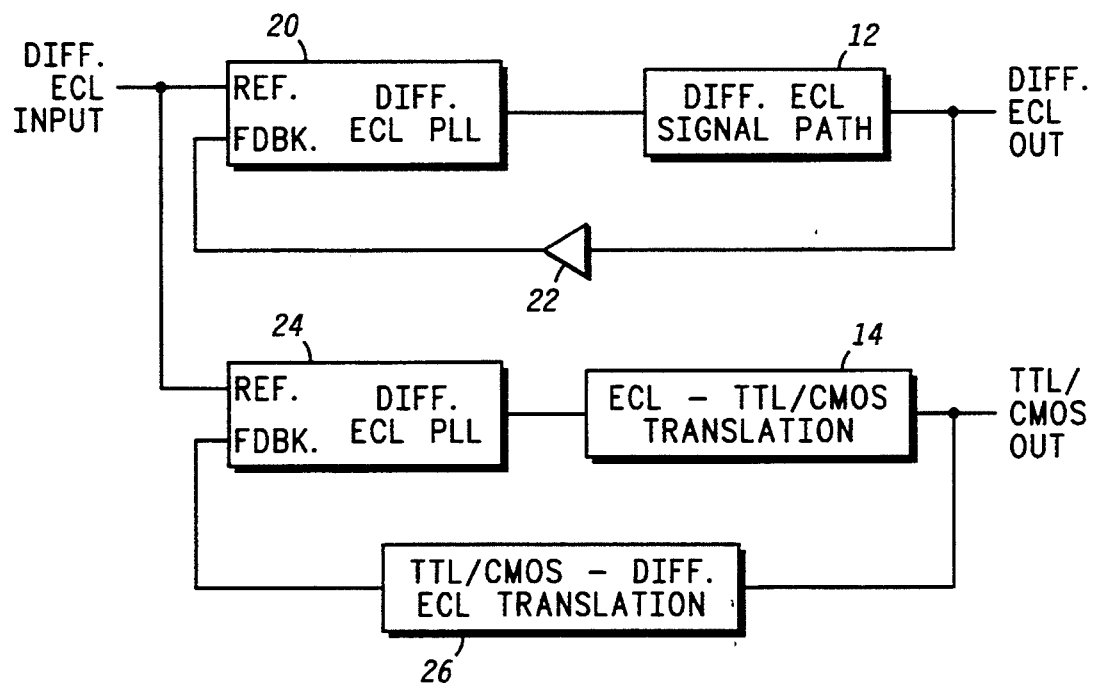
FIG. 2 is a detailed block diagram illustrating a circuit for providing phase synchronization between ECL logic signals and TTL/CMOS logic signals in accordance with the present invention.

Referring to FIG. 2, there is illustrated a circuit and method for providing phase synchronization between ECL logic signals and TTL/CMOS logic signals wherein the ECL logic signals are typically differential signals while the TTL/CMOS signals are typically single-ended signals, but it is not intended to limit the present invention to such choices. FIG. 2 includes differential ECL phase locked loop (PLL) 20 having a reference input coupled to receive a differential ECL input signal and an output coupled to differential ECL signal path 12. Further, the output of ECL signal path block 12 provides a differential ECL output signal. Further, the output of ECL signal path 12 is also coupled to the feedback input of PLL 20 via delay component 22.

Moreover, FIG. 2 includes second differential ECL phase locked loop 24 which also has a reference input coupled to receive the differential ECL input signal. The output of PLL 24 is coupled to an input of ECL to TTL/CMOS translation block 14 the output of which provides a TTL/CMOS output signal. Further, the output of translation block 14 is also coupled through TTL/CMOS to differential ECL translation block 26 to the feedback input of PLL 24.

The present invention utilizes the fact that because TTL/CMOS-ECL translation block 26 typically has a substantially smaller propagation delay than a typical ECL-TTL/CMOS translation block, it is much easier to match the delay of translation block 26 with that of delay component 22. For example, the propagation delay of TTL/CMOS-ECL translation block 26 is typically about 100 ps (picoseconds), while the propagation delay of a typical ECL-TTL/CMOS translation block is about 2.5-3 ns. As a result, the matching of translation block 26 with delay component 22 can be done substantially more accurately over process, temperature and voltage supply variation with substantial improvement over trying to match an ECL-TTL/CMOS translation block with delay components as was attempted in the prior art.

In particular, the present invention utilizes phase locked loops 20 and 24 to make the differences of delays through ECL-TTL/CMOS translation block 14 and ECL signal path block 12 irrelevant since it is well understood that PLLs 20 and 24 will automatically align the signal edges appearing at its reference and feedback inputs to within a predetermined amount of phase error, for example, about 50 ps for an ECL PLL. Therefore, in order to provide a differential ECL output signal that is in phase synchronization with a TTL/CMOS output signal, one only needs to match the delay of translation block 26 with that of delay component 22. Moreover, as aforementioned, this task is significantly easier since the propagation delay of TTL/CMOS-ECL translation block 26 is substantially smaller than the propagation delay through an ECL-TTL/CMOS translation block such as block 14.

Although FIG. 2 shows a circuit for providing phase synchronization for ECL and TTL/CMOS output logic signals from an ECL input signal, it is understood that the present invention may be generally used to provide first and second phase synchronous output logic signals from a first or even a third input logic signal.

By now it should be apparent from the foregoing discussion that a novel circuit and method for providing phase synchronization between an ECL output signal and a TTL or CMOS output signal has been provided. The circuit includes phase locked loops to make the difference of delays through an ECL-TTL/CMOS translation path with that of a straight ECL path irrelevant. As a result, in order to achieve phase synchronization between an ECL signal and a TTL/CMOS signal, one only needs to match the propagation delay of a delay component to that of a TTL/CMOS-ECL translator as opposed to a delay component and an ECL-TTL/CMOS translator.

While the invention has been described in specific embodiment of thereof, it is evident that many alterations, modifications and variations will be apparent to those skilled in the art. Further, it is intended to embrace all such alterations, modifications and variations in the appended claims.

We claim:

1. A circuit responsive to a first input logic signal for providing phase synchronization between first and second output logic signals, comprising:
 a first phase locked loop (20) having a reference input, a feedback input and an output, said reference input of said first phase locked loop coupled to receive the first input logic signal, said output of said first phase locked loop coupled to provide the first output logic signal;
 a second phase locked loop (24) having a reference input, a feedback input and an output, said reference input of said second phase locked loop coupled to receive the first input logic signal;
 a first translation circuit (14) having an input and an output, said input of said first translation circuit coupled to said output of said second phase locked loop, said output of said first translation circuit providing the second output logic signal;
 a second translation circuit (26) having an input and an output, said input of said second translation circuit coupled to said output of said first translation circuit, said output of said second translation circuit coupled to said feedback input of said second phase locked loop; and
 a delay component (22) having an input and an output, said input of said delay circuit coupled to receive the first output logic signal, said output of said delay circuit coupled to said feedback input of said second phase locked loop, wherein a delay of said delay circuit is matched to a delay of said second translation circuit.

2. The circuit according to claim 1 wherein the first output logic signal is an ECL signal and the second output logic signal is a TTL signal.

3. The circuit according to claim 1 wherein the first output logic signal is an ECL signal and the second output logic signal is a CMOS signal.

4. The circuit according to claim 1 wherein the first input logic signal is an ECL signal.

5. A method for providing phase synchronization between first and second output logic signals from a first input logic signal wherein there exists a first signal path between the first input logic signal and the first output logic signal and wherein there exists a second signal path between the first input logic signal and the second output logic signal, the second logic path including a first translation circuit, the method comprising the steps of:
 placing a first phase locked loop in the first signal path, said first phase locked loop having a reference input coupled to receive the first input logic signal, said first phase locked loop having a feedback input and an output;
 placing a second phase locked loop in the second signal path, said second phase locked loop having a reference input coupled to receive the first input logic signal, said second phase locked loop having a feedback input and an output;
 placing a second translation circuit between the first translation circuit and said feedback input of said second phase locked loop;
 placing a delay component between said output and said feedback input of said first phase locked loop; and
 matching a propagation delay of said delay component to a propagation delay of said second translation circuit thereby providing phase synchronization between the first and second output logic signals.

6. The circuit according to claim 5 wherein the first output logic signal is an ECL signal and the second output logic signal is a TTL signal.

7. The circuit according to claim 5 wherein the first output logic signal is an ECL signal and the second output logic signal is a CMOS signal.

8. The circuit according to claim 5 wherein the first input logic signal is an ECL signal.

9. A method for providing phase synchronization between first and second output logic signals from a first input logic signal wherein there exists a first signal path between the first input logic signal and the first output logic signal and wherein there exists a second signal path between the first input logic signal and the second output logic signal, the second logic path including a first translation circuit, the method comprising the steps of:
 placing a first phase locked loop in the first signal path;
 placing a second phase locked loop in the second signal path;
 translating the second output logic signal to a first signal having a logic state of the first input logic signal and applying said first signal to an input of said second phase locked loop;
 delaying the first output logic signal by a predetermined amount thereby generating a delayed signal;
 applying said delay signal to an input of said first phase locked loop; and
 matching such a delay of said delay signal with respect to the first output logic signal to a delay of said first signal with respect to the second output logic signal thereby providing phase synchronization between the first and second output logic signals.

10. The circuit according to claim 9 wherein the first output logic signal is an ECL signal and the second output logic signal is a TTL signal.

11. The circuit according to claim 9 wherein the first output logic signal is an ECL signal and the second output logic signal is a CMOS signal.

12. The circuit according to claim 9 wherein the first input logic signal is an ECL signal.

* * * * *